(12) United States Patent
Chino

(10) Patent No.: US 9,380,712 B2
(45) Date of Patent: Jun. 28, 2016

(54) WIRING SUBSTRATE AND SEMICONDUCTOR DEVICE

(71) Applicant: SHINKO ELECTRIC INDUSTRIES CO., LTD., Nagano-shi, Nagano (JP)

(72) Inventor: Teruaki Chino, Nagano (JP)

(73) Assignee: SHINKO ELECTRIC INDSTRIES CO., LTD., Nagano-shi, Nagano (JP)

( * ) Notice: Subject to any disclaimer, the term of this patent is extended or adjusted under 35 U.S.C. 154(b) by 91 days.

(21) Appl. No.: 14/087,350

(22) Filed: Nov. 22, 2013

(65) Prior Publication Data

US 2014/0146503 A1  May 29, 2014

(30) Foreign Application Priority Data

Nov. 28, 2012  (JP) ................................. 2012-259682

(51) Int. Cl.
| | |
|---|---|
| *H05K 7/10* | (2006.01) |
| *H05K 3/40* | (2006.01) |
| *H01L 23/498* | (2006.01) |
| *H01L 21/48* | (2006.01) |
| *H05K 3/34* | (2006.01) |

(52) U.S. Cl.
CPC .......... *H05K 3/4007* (2013.01); *H01L 21/4853* (2013.01); *H01L 23/49816* (2013.01); *H01L 23/49822* (2013.01); *H01L 23/49827* (2013.01); *H01L 23/49894* (2013.01); *H01L 2224/16225* (2013.01); *H01L 2224/32225* (2013.01); *H01L 2224/73204* (2013.01); *H05K 3/3436* (2013.01); *H05K 3/3473* (2013.01); *H05K 2201/0338* (2013.01)

(58) Field of Classification Search
USPC ................................... 361/767; 174/267, 261
See application file for complete search history.

(56) References Cited

U.S. PATENT DOCUMENTS

| | | | |
|---|---|---|---|
| 6,831,234 B1 * | 12/2004 | Asai | ................ H01L 23/49816 174/255 |
| 2009/0160063 A1 * | 6/2009 | Okumura et al. | ............. 257/773 |

FOREIGN PATENT DOCUMENTS

| | | |
|---|---|---|
| JP | H10-326965 A | 12/1998 |
| JP | 2004-200412 A | 7/2004 |
| JP | 2006295109 A | 10/2006 |

* cited by examiner

*Primary Examiner* — Andargie M Aychillhum
(74) *Attorney, Agent, or Firm* — Drinker Biddle & Reath LLP

(57) ABSTRACT

There is provided a wiring substrate. The wiring substrate includes: a wiring pattern of an outermost layer; a solder resist layer having an opening portion therein, wherein a portion of the wiring pattern is exposed through the opening portion, and the exposed portion of the wiring pattern is defined as a connection pad; and a solder bump on the connection pad. The connection pad includes: a solder layer; and a metal post that is entirely covered by the solder layer, wherein a portion of the solder layer is interposed between the connection pad and the metal post.

3 Claims, 5 Drawing Sheets

WIRING SUBSTRATE AND SEMICONDUCTOR DEVICE

This application claims priority from Japanese Patent Application No. 2012-259682, filed on Nov. 28, 2012, the entire contents of which are herein incorporated by reference.

BACKGROUND OF THE INVENTION

1. Technical Field

The present disclosure relates to a wiring substrate and a semiconductor device.

2. Description of the Related Art

A wiring substrate including solder bumps that are connected with an electric component such as a semiconductor chip has been known (see JP-A-10-326965 and JP-A-2004-200412 for example). In addition, as a method of producing such a wiring substrate, the following method has been known.

First, a structural body illustrated in FIG. 6A, for example, is prepared. This structural body is configured of connection pads 80P to be connected to build-up wirings (not illustrated), the connection pads 80P being formed on an interlayer insulating layer 81, and a solder resist layer 82 having opening portions 82X that are positioned above the corresponding connection pads 80P. Next, a seed layer 83 is formed so as to cover an upper surface of the solder resist layer 82 including inner surfaces of the opening portions 82X, and connection pads 80P exposed through the opening portions 82X. Then, a resist layer 84 is formed on the seed layer 83. The resist layer 84 includes opening portions 84X, each of which has a diameter larger than a diameter of the opening portions 82X.

Next, in a process illustrate in FIG. 6B, a solder plating method (for example, a Sn—Cu electrolytic plating method), which uses the seed layer 83 as a power feeding layer, is performed, using the resist layer 84 as a plating mask, thereby to form solder plating layers 85 on the seed layer 83 that has been exposed through the opening portions 84X. Subsequently, in a process illustrated in FIG. 6C, the resist layer 84 illustrated in FIG. 6B and unnecessary parts of the seed layers 83 below the resist layer 84 are removed. Then, the solder plating layers 85 are reflow-heated, so that the solder plating layer 85 are melted and thus bonded with the corresponding connection pads 80P. With this, solder bumps 86 protruding from the upper surface of the solder resist layer 82 are obtained, as illustrated in FIG. 6D.

In recent years, along with advancement in a semiconductor chip technology, a pitch of the connection pads in the wiring substrate has been made narrower. In addition, the solder bumps 86 need to be sufficiently high (for example, 40 µm or higher) from the upper surface of the solder resist layer 82 in the wiring substrate, in order to accomplish sufficient reliability of electric connection with the semiconductor chip. However, as the pitch of the connection pads 80P is narrower, it becomes difficult to form higher solder bumps 86. Namely, when the solder plating layers 85 are formed thicker in order to ensure sufficient heights of the solder bumps 85, a resultant solder bump tends to contact an adjacent solder bump, as solder bumps 85A illustrated in FIG. 7. Such solder bumps 85A cause short circuits. Therefore, it is difficult to form the high solder bumps 86, and to realize reliable mounting of the semiconductor chips on the wiring substrate.

SUMMARY OF THE INVENTION

An illustrative aspect of the present invention is to provide a wiring substrate where short circuits by adjacent solder bumps can be effectively suppressed.

According to one or more illustrative aspects of the present invention, there is provided a wiring substrate. The wiring substrate includes: a wiring pattern of an outermost layer; a solder resist layer having an opening portion therein, wherein a portion of the wiring pattern is exposed through the opening portion, and the exposed portion of the wiring pattern is defined as a connection pad; and a solder bump on the connection pad. The connection pad includes: a solder layer; and a metal post that is entirely covered by the solder layer, wherein a portion of the solder layer is interposed between the connection pad and the metal post.

DETAILED DESCRIPTION

In the following, an embodiment according to the present invention will be described with reference to the accompanying drawings.

The accompanying drawings may illustrate features of the embodiment in an enlarged form for the sake of illustration, in order to make the features easily understood. Thus, there is no intention to indicate scale or relative proportions among members or components. In addition, hatching of portions of the members or components is omitted in some cross-sectional views, in order to make their cross-sectional structures easily understood.

First, a wiring substrate 10 will be described.

Figure 1A:
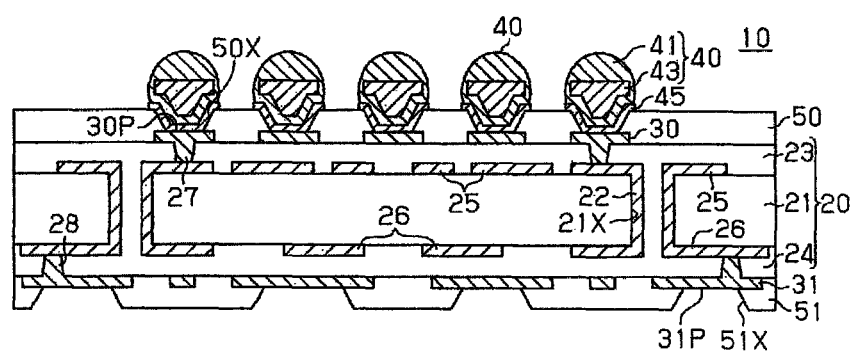
FIG. 1A is a schematic cross-sectional view illustrating a wiring substrate according to an embodiment of the present invention.

Referring to FIG. 1A, the wiring substrate 10 includes a substrate body 20, an uppermost layer wiring pattern 30, and a lowermost layer wiring pattern 31, solder bumps 40, and solder resist layers 50, 51.

The substrate body 20 includes a core substrate 21, a through electrodes 22 formed in through holes 21X of the core substrate 21, plural insulating layers 23, 24 formed on the core substrate 21, wirings 25 and 26 that are formed respectively on an upper surface and a lower surface of the core substrate 21, and vias 27 and 28 that are formed respectively in the insulating layers 23 and 24. The wiring pattern 30 and the wiring pattern 31 are electrically connected with each other by the through electrodes 22, the wirings 25, 26, and the vias 27, 28 provided in the substrate body 20. As a material of the core substrate 21, an insulating resin such as a glass epoxy resin may be used, for example. In addition, as materials of the wirings 25, 26 and the vias 27, 28, copper (Cu) or a copper alloy may be used, for example. Moreover, as materials of the insulating layers 23, 24, an insulating resin such as an epoxy-based resin and a polyimide-based resin may be used, for example.

The wiring patter 31 is provided on the lower surface side of the substrate body 20, specifically on the insulating layer 24. The wiring pattern 31 includes external connection pads 31P having external connection terminals (not illustrated) such as lead pins and solder balls for mounting on an electronic substrate such as a mother board. The external connection pads 31P are arranged in a matrix in planar view, although not illustrated. In addition, a planar view shape of each of the external connection pads 31P may be circular.

The solder resist layer 51 is provided on a lower surface of the insulating layer 24 so as to cover predetermined portions of the wiring pattern 31. As a material of the solder resist 51, an insulating resin such as an epoxy-based resin may be used, for example. In the solder resist layer 51, a plurality of opening portions 51X are formed. The opening portions 51X allow predetermined portions of the wiring pattern 31 to be exposed as the external connection pads 31P. Each of the opening portions 51X has a shape of taper. Namely, an inner diameter of the opening portion 51X becomes smaller along a direction from a lower side to an upper side (the side of the wiring pattern 31), as illustrated in FIG. 1A. More specifically, each of the opening portions 51X has a shape of frustum of circular cone whose inner diameter is smaller at an upper opening end than at a lower opening end. Also, the portions of the wiring pattern 31 exposed through the opening portions 51X may undergo an organic solderbility preservative (OSP) treatment thereby to form an OSP film thereon, and the external connection terminals may be connected to the OSP film. In addition, a metal layer may be formed on the portions of the wiring pattern 31 exposed through the opening portions 51X, and the external connection terminals may be connected to the metal film. As an example of the metal layer, there may be a gold (Au) layer, a nickel (Ni)/gold layer (a metal layer composed of a Ni layer and an Au layer stacked in this order on the lower surface of the wiring pattern 31), a Ni/palladium (Pd)/Au layer (a metal layer composed of a Ni layer, a Pd layer, and an Au layer stacked in this order on the lower surface of the wiring pattern 31), or the like. In addition, the portions of the wiring pattern 31 exposed through the opening portions 51X (or the OSP film, when the OSP film is formed on the wiring pattern 31, or the metal layer, when the metal layer is formed on the wiring pattern 31) can serve as the external connection pads. The thickness of the solder resist layer 51 may be, for example, about 15 to 30 μm.

On the other hand, the wiring pattern 30 is provided on a chip mounting surface (on an upper surface) of the substrate body 20. The wiring pattern 30 includes connection pads 30P that are to be connected with corresponding bumps 61 of a semiconductor chip 60 (see FIG. 2) to be mounted on the wiring substrate 10. The connection pads 30P are arranged in a matrix, depending on an arrangement of the bumps 61 of the semiconductor chip 60, in planar view in a mount area in which the semiconductor chip 60 is mounted, although not illustrated. A planar view shape of each of the connection pads 30P may be, for example, circular. A diameter of each of the connection pads 30P may be, for example, about 30 to 40 μm.

The solder resist layer 50 is provided on the chip mounting surface of the substrate body 20 so as to cover the wiring pattern 30. As a material of the solder resist layer 50, an insulating resin such as an epoxy-based resin may be used, for example. In the solder resist layer 50, a plurality of opening portions 50X are formed. The plurality of opening portions 50X allow predetermined portions of the wiring pattern 30 to be exposed as the connection pads 30. Each of the opening portions 50X has a shape of taper. Namely, the inner diameter of the opening portion 50X becomes smaller along a direction from the upper side to the lower side (the side of the wiring pattern 30), as illustrated in FIG. 1A. Specifically, each of the opening portions 50X has a shape of frustum of circular cone whose inner diameter is smaller at a lower opening end than at an upper opening end. Solder bumps 40 are formed substantially on the wiring pattern 30 exposed through the corresponding opening portions 50X, namely, the connection pads 30P. Specifically, metal films 45 are formed on the corresponding connection pads 30P, and the solder bumps 40 are formed on the corresponding metal films 45. The metal films 45 are forms so as to cover an upper surface of the solder resist layer 50 positioned around the opening portions 50X, the inner surfaces of the opening portions 50X, and the upper surface of the wiring pattern 30 exposed through the opening portions 50X. Namely, each of the metal films 45 has a shape of hollow hat. As a material of the metal films 45, copper or a copper alloy may be used, for example. The thickness of the metal films 45 may be, for example, about 0.5 to 1 μm. In addition, the thickness of the solder resist layer 50 may be, for example, about 15 to 30 μm.

Next, structures of the solder bumps 40 will be described.

Figure 1B:
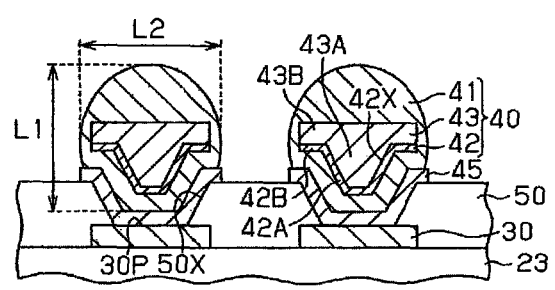
FIG. 1B is a partially enlarged cross-sectional view illustrating the wiring substrate of FIG. 1A.

Referring to FIG. 1B, each of the solder bumps 40 includes a solder layer 41, a metal layer 42, and a metal post 43.

The solder layer 41 is formed so as to entirely cover the metal layer 42 and the metal post 43. The solder layer 41 is formed so as to be attracted by the metal post 43 and so as to extend along the thickness direction. Specifically, the solder layer 41 is formed so as to extend more in the thickness direction than in a planar direction that perpendicularly intersects the thickness direction in cross-sectional view. Namely, a cross-sectional view of the solder layer 41 is substantially a shape of ellipse, specifically substantially a shape of ellipse whose long axis extends in the thickness direction. For example, the solder layer 41 has a length L1 (FIG. 1B) of about 65 to 75 μm in the thickness direction and a length L2 (FIG. 1B) of 50 to 60 μm in the planar direction. As a material of the solder layer 41, an alloy of tin (Sn) and Cu or an alloy of Sn, silver (Ag), and Cu may be used, for example.

The metal layer 42 is held in such a manner that the metal layer 42 is floated within the solder layer 41. The entire side surface and the entire lower surface of the metal layer 42 are covered by the solder layer 41. The metal layer 42 is formed conformal with the metal layer 45, while a portion of the solder layer 41 is intervened between the metal layer 42 and the metal layer 45. Namely, the metal layer 42 is formed so as to have a shape of hollow hat. Specifically, the metal layer 42 is formed so as to have a body portion 42A and a brim portion 42B that protrudes outwardly from an end portion of the body portion 42A, and a concave portion 42X is formed in the body portion 42A. The concave portion 42X is formed so as to extend downwardly toward the connection pad 30P from the brim portion 42B. Specifically, the concave portion 42X is formed to have a shape of taper whose inner diameter becomes smaller along a direction from the upper side to the lower side (the side of the wiring pattern 30) in FIG. 1B. For example, the concave portion 42X in this embodiment is formed to have a shape of frustum of circular cone whose inner diameter is smaller at a lower opening end than at an upper opening end. As a material of the metal layer 42, similarly to the solder layer 41, an alloy of Sn or Cu, or an alloy of Sn, Ag, and Cu may be used, for example. However, the metal layer 42 is a Cu-rich metal layer compared with the solder layer 41. Namely, the contained amount of Cu in the metal layer 42 is higher than that in the solder layer 41. For example, A Cu concentration of the Cu-rich metal layer 42 may be, for example, about 80 to 95 wt %. The thickness of the metal layer 42 may be, for example, 1 to 3 μm.

The metal post 43 is formed on the metal layer 42. The metal post 43 is held in such a manner that the metal post 43 is floated within the solder layer 41. The entire side surface and the entire upper surface of the metal post 43 are covered by the solder layer 41. The metal post 43 is formed to have a shape of post that extends in the thickness direction. Specifically, the metal post 43 is formed to have a T-shaped cross section. More specifically, the metal post 43 includes a post portion 43A formed to fill the concave portion 42X, and a larger diameter portion 43B that is formed to cover the upper surface of the post portion 43A and an upper portion of the brim portion 42B. The larger diameter portion 43B has a diameter larger than that of the post portion 43A.

The post portion 43A is formed so as to extend downwardly from the lower surface of the larger diameter portion 43B. A portion of the post portion 43A enters the opening portion 50X. Namely, the portion of the post portion 43A is arranged inside the opening portion 50X. The post portion 43A is formed to have a shape of taper whose diameter becomes smaller along a direction from the upper side to the lower side, as illustrated in FIG. 1B. Specifically, the post portion 43A in this embodiment is formed so as to have a shape of frustum of circular cone whose diameter is smaller at a lower surface than at an upper surface. The height of the post portion 43A formed in the above manner may be, for example, about 15 to 18 μm. In addition, the diameter of the upper surface of the post portion 43A may be, for example, about 40 to 50 μm.

The larger diameter portion 43B is formed so as to extend upwardly from the upper surface of the brim portion 42B and the upper surface of the post portion 43A. The larger diameter portion 43B in this embodiment is formed to have a shape of cylinder (or disk). The diameter of the larger diameter portion 43B is larger than that of the upper surface of the post portion 43A. For example, the diameter of the larger diameter portion 43B may be, for example, about 45 to 55 μm. The thickness of the larger diameter portion 43B may be, for example, about 3 to 5 μm.

As materials of the post portion 43A and the larger diameter portion 43B (namely, the metal post 43), a metal such as nickel and gold, or an alloy containing at least one kind of these metals may be used, for example. In this embodiment, copper is used to form the metal post 43.

A pitch of the solder bumps 40 having such a structure may be, for example, about 90 to 105 μm. In addition, a clearance between adjacent two of the solder bumps 40 may be, about 20 to 45 μm.

Next, a structure of a semiconductor device 11 will be described.

Figure 2:
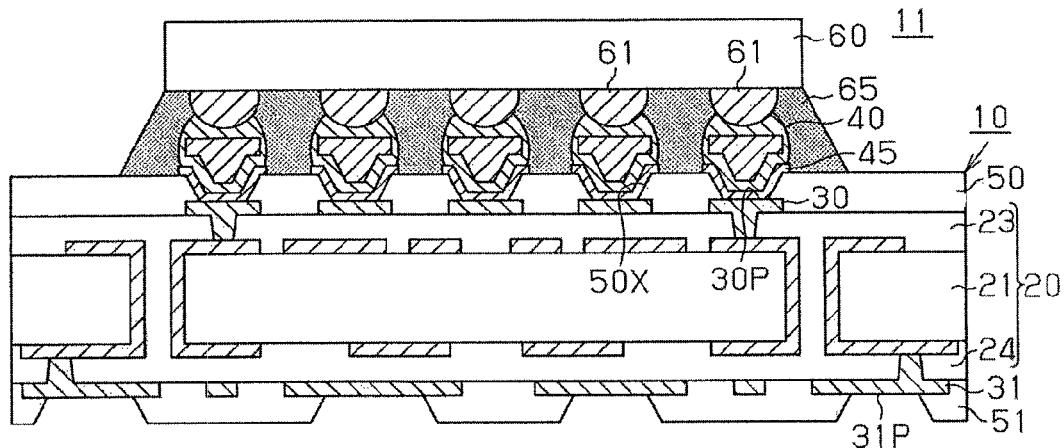
FIG. 2 is a schematic cross-sectional view illustrating a semiconductor device according to an embodiment of the present invention.

Referring to FIG. 2, the semiconductor device 11 includes the wiring substrate 10 described as above, a semiconductor chip 60 mounted on the wiring substrate 10, and an underfill resin portion 65.

The semiconductor chip 60 includes a plurality of bumps 61 formed on its circuit surface (a lower surface in FIG. 2). The semiconductor chip 60 is electrically connected with the connection pads 30P of the wiring substrate 10 through the bumps 61 and the solder bumps 40. Namely, the semiconductor chip 60 is flip-chip bonded with the wiring substrate 10.

As the semiconductor chip 60, a logic chip such as a central processing unit (CPU) chip and a graphics processing unit (GPU) chip may be used, for example. The semiconductor chip 60 may have a dimension of, for example, about 3 mm×3 mm to about 12 mm×12 mm in planar view. The thickness of the semiconductor chip 60 may be, for example, 50 to 100 μm.

In addition, as the bumps 61, gold bumps or solder bumps may be used, for example. As a material of the solder bumps, an alloy containing lead (Pb), an alloy of Sn and Au, an alloy of Sn and Cu, an alloy of Sn and Ag, an alloy of Sn, Ag, and Cu, or the like may be used.

The underfill resin portion 65 is formed so as to fill a gap between the upper surface of the wiring substrate 10 and the lower surface of the semiconductor chip 60. The underfill resin portion 65 is provided in order to enhance the connection strength of a connection portion between the bump 61 and the solder bump 40 (connection pad 30P), and to suppress occurrence of corrosion or electromigration in the wiring pattern 30, thereby to prevent the reduction in the reliability of the wiring pattern 30. As a material of the underfill resin portion 65, an insulating resin such as an epoxy-based resin may be used, for example.

Next, operational effects of the wiring substrate 10 and the semiconductor device 11 will be described.

The solder bumps 40, each of which includes the solder layer 41 and the metal post 43 that is entirely covered by the solder layer 41 and extends in a form of post in the thickness direction, is formed on the corresponding connection pads 30P. Namely, the metal post 43 is held in such a manner that the metal post 43 is floated within the solder layer 41 of the solder bump 40. With this, the solder layer 41 is formed so as to be attracted by the metal post 43 formed within the solder layer 41. Therefore, the solder layer 41 is restrained from spreading in a planar direction, and thus the solder layer 41 is formed so as to extend longer in the thickness direction than in the planar direction. In such a manner, the metal post 43, which has a greater stiffness than the solder layer 41, serves as a core, and thus the solder layer 41 (the solder bump 40) is formed and maintained to have a greater height.

Next, a method of producing the wiring substrate 10 will be described.

Figure 3A:
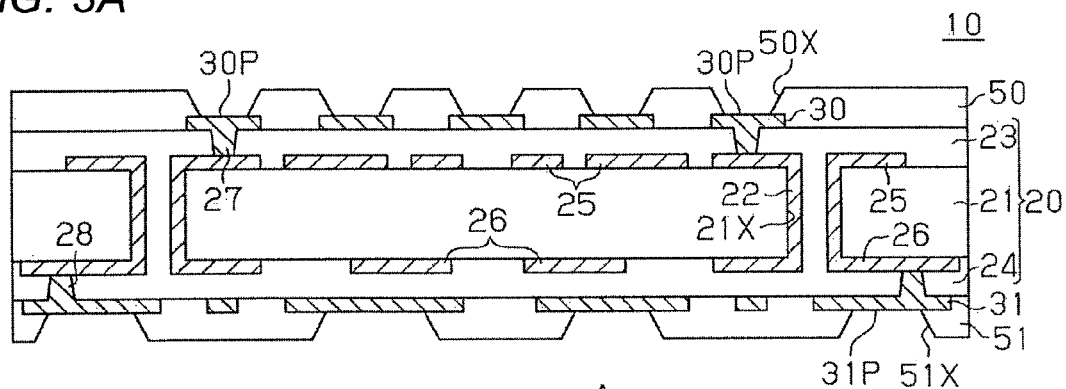
FIGS. 3A and 3B are schematic cross-sectional views illustrating a method of producing a wiring substrate, according to the embodiment of the present invention.

As illustrated in FIG. 3A, firstly, a wiring substrate is prepared. This wiring substrate is identical to one obtained by removing the solder bumps 40 from the wiring substrate 10. For the sake of explanation, a reference symbol "10" is also given to the wiring substrate in FIG. 3A. Because this wiring substrate 10 can be produced by a known method, a method of producing the wiring substrate 10 illustrated in FIG. 3A is explained only briefly.

First, the through holes 21X are formed in predetermined positions of the core substrate 21, and inner surfaces of the through holes 21X are plated to form the through electrodes 22, which allow for electrical connections between both surfaces of the core substrate 21. Then, wirings 25, 26 are formed by, for example, a subtractive method. Next, the insulating layer 23, 24 are formed on the upper surface and the lower surface of the core substrate 21, respectively, by laminating resin films on the upper and lower surfaces by a vacuum laminating method, and heating to cure the resin films. Incidentally, the insulating layer 23, 24 may be formed by applying a paste-type resin or a liquid-type resin and heating such resins. Next, opening portions are formed through the insulating layers 23, 24, and a desmear treatment is performed, when needed. Then, the vias 27, 28 and the wiring patterns 30, 31 are formed by, for example, a semi-additive method. Subsequently, the solder resist layer 50 is formed which has the opening portions 50X that allow parts of the wiring pattern 30 to be exposed as the connection pads 30P; and the solder resist layer 51 is formed which has the opening portions 51X that allow parts of the wiring pattern 31 to be exposed as the connection pads 31P.

Figure 3B:
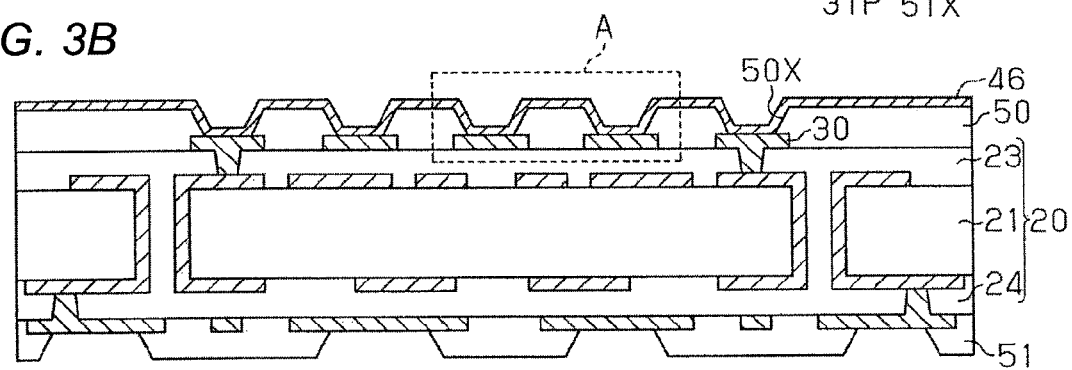

Subsequently, in a process illustrated in FIG. 3B, the seed layer 46 is formed so as to cover the entire upper surface (top surface) of the solder resist layer 50 including inner surfaces of the opening portions 50X, and the upper surfaces of the connection pads 30P exposed through the opening portions 50X. As a material of the seed layer 46, copper or a copper alloy can be used, for example. The seed layer 46 may be formed by, for example, a non-electrolytic method or a sputtering method.

The following processes will be described with reference to a partially enlarged cross-sectional view that illustrates a portion "A" of the wiring substrate 10 of FIG. 3B (refer to a broken line box in FIG. 3B).

Figure 4A:
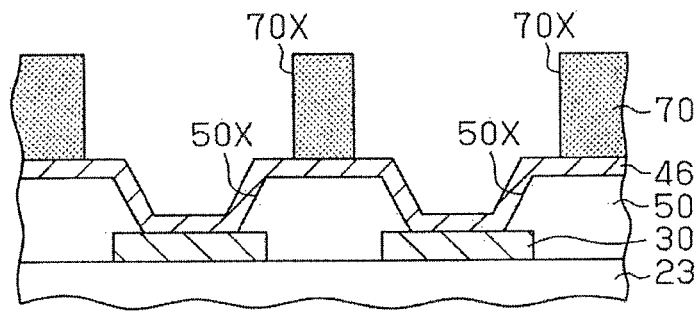
FIGS. 4A through 4D are schematic cross-sectional views illustrating the method of producing the wiring substrate, according to the embodiment of the present invention.

In a process illustrated in FIG. 4A, a resist layer 70 is formed on the seed layer 46. The resist layer 70 includes opening patterns 70X at predetermined positions. Specifically, the opening patterns 70X are formed so as to allow parts of the seed layer 46, which are in the positions where the solder balls 40 (see FIG. 1) are to be arranged, to be exposed. In addition, each of the opening patterns 70X has a diameter larger than that of the opening portion 50X of the solder resist layer 50. Therefore, a portion of the seed layer 46 formed on the solder resist layer 50 is exposed through the opening patterns 70X of the resist layer 70. As a material of the resist layer 70, a plating-resistant material may be used. Specifically, as a material of the resist layer 70, a photosensitive dry film resist, a liquid-form photoresist (a dry film resist such as a novolak-based resist and an acrylic-based resist, or a liquid resist) or the like may be used, for example. For example, when the photosensitive dry film resist is used, the dry film is laminated on the upper surface of the seed layer 46 by a thermocompression bonding method, and then patterned by a photolithography method, thereby to form the resist layer 70 having the opening patterns 70X. In addition, even when the liquid-form photoresist is used, the resist layer 70 may be formed through similar processes. Incidentally, a planar view shape of the opening pattern 70X is circular, and the diameter of the opening pattern 70X may be, for example, about 60 to 70 μm.

Figure 4B:
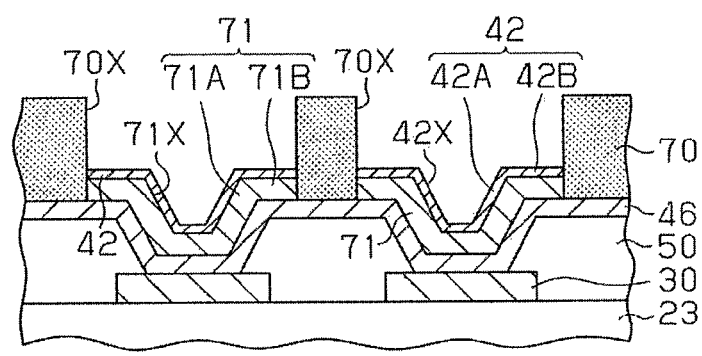

Next, in a process illustrated in FIG. 4B, an electrolytic plating method is performed with respect to the upper surface of the seed layer 46. In this electrolytic plating method, the resist layer 70 is used as a plating mask and the seed layer 46 is used as a power feeding layer. Specifically, a solder plating layer 71 and the Cu-rich metal layer 42 are formed in this order on the seed layer 46 by performing the electrolytic plating method (for example, a Sn—Cu electrolytic plating method) with respect to the upper surface of the seed layer 46 exposed through the opening patterns 70X of the resist layer 70. More specifically, a structure illustrated in FIG. 4A is immersed in a plating solution for the Sn—Cu electrolytic plating, and the electrolytic plating is performed with a relatively larger electric current density (for example, 1.5 A/dm$^2$) at an initial stage, thereby to form the solder plating layer 71 that contains a relatively larger amount of Sn. Then, while the structure with the solder plating layer 71 formed thereon is kept immersed in the plating solution, the electrolytic plating is performed with a relatively smaller electric current density (for example, 0.5 A/dm$^2$), thereby to form the Cu-rich metal layer 42 that scarcely contains Sn on the solder plating layer 71. With this, the solder plating layer 71 is formed along the shape of the seed layer 46 thereby to cover the entire upper surface of the seed layer 46 exposed through the opening patterns 70X; and the metal layer 42 is formed along with the shape of the solder plating layer 71 (and the seed layer 46 below) so as to cover the entire upper surface of the solder plating layer 71. Therefore, the solder plating layer 71 and the metal layer 42 have a shape of hollow hat. Namely, the solder plating layer 71 includes a body portion 71A having a concave portion 71X, and a brim portion 71B that protrudes outwardly from an upper end portion of the body portion 71A. Similarly, the metal layer 42 includes a body portion 42A having a concave portion 42X, and a brim portion 42B that protrudes outwardly from an upper end portion of the body portion 42A. As described above, plating conditions such as plating time of the Sn—Cu electrolytic plating in this embodiment are controlled in such a manner that the concave portion 71X is formed in the body portion 71A of the solder plating layer 71 and the concave portion 41X is formed in the body portion 41A of the metal layer 41. The thickness of the solder plating layer 71 may be, for example, about 10 to 15 μm, and the thickness of the metal layer 42 may be, for example, about 1 to 3 μm.

Figure 4C:
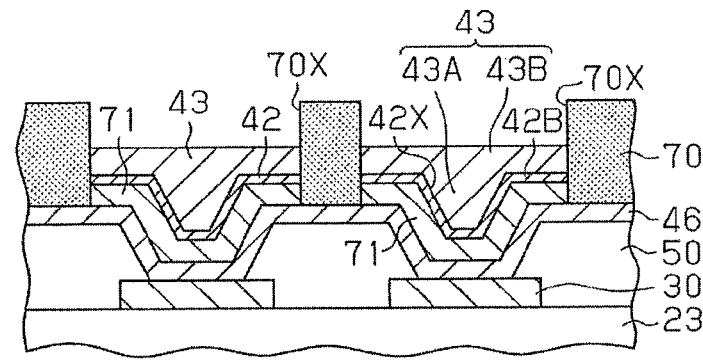

Next, in a process illustrated in FIG. 4C, another electrolytic plating method is performed with respect to the upper surface of the metal layer 42. In this electrolytic plating method, the seed layer 46 is used as a power feeding layer, and the resist layer 70 is used as a plating mask. Specifically, the metal post 43 is formed on the metal layer 42 by performing the electrolytic plating method (for example, a Cu electrolytic plating method) with respect to the upper surface of the metal layer 42. The metal post 43 includes the cylindrical post portion 43A that fills the concave portion 42X of the metal layer 42, and the cylindrical larger diameter portion 43B that covers the upper surface of the post portion 43A and the upper surface of the brim portion 42B of the metal layer 42. In this case, because the Cu electrolytic plating method is performed with respect to the Cu-rich metal layer 42 that scarcely contains Sn rather than a metal layer formed of a Sn—Cu alloy that contains a relatively larger amount of Sn, the metal post 43 (a Cu plating layer) is favorably formed on the metal layer 42.

Subsequently, in a process illustrated in FIG. 4D, yet another electrolytic plating method is performed with respect to the upper surface of the metal post 43. In this electrolytic plating method, the resist layer 70 is used as a plating mask, and the seed layer 46 is used as a power feeding layer. Specifically, the solder plating layer 72 is formed on the metal post 43 by performing the electrolytic plating method (for example, Sn—Cu electrolytic plating method) with respect to the upper surface of the metal post 43. With this, the solder plating layer 72 made of a Sn—Cu alloy is formed so as to cover the entire upper surface of the metal post 43. The thickness of the solder plating layer 72 may be, for example, about 3 to 5 μm. Incidentally, a material of the solder plating layer 72 is not necessarily limited to the Sn—Cu alloy, but the solder plating layer 72 may be formed of Sn or other materials.

Figure 4D:
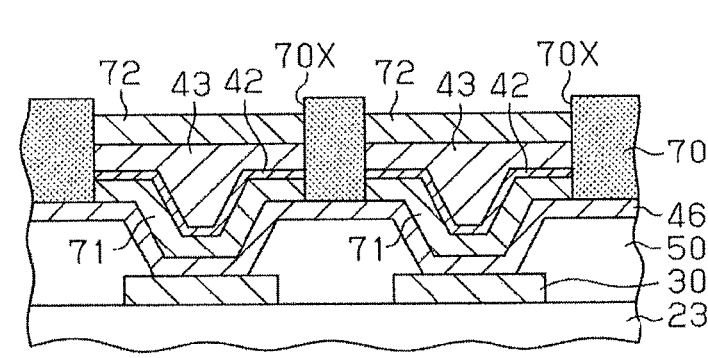
Figure 5A:
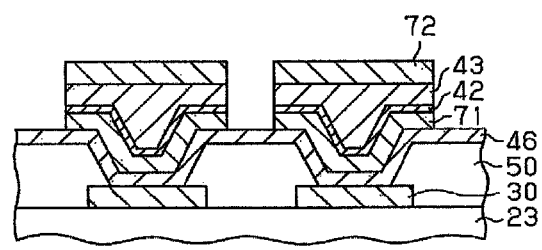
FIGS. 5A through 5C are schematic cross-sectional views illustrating the method of producing the wiring substrate, according to the embodiment of the present invention.

Next, in a process illustrated in FIG. 5A, the resist layer 70 illustrated in FIG. 4D is removed by using, for example, an alkali stripping solution.

Figure 5B:
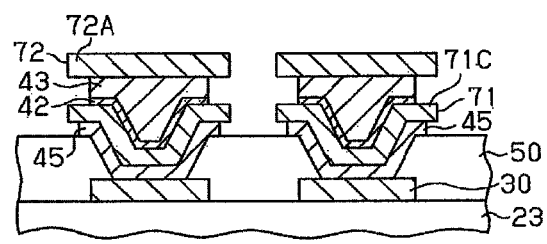

Next, the seed layer 46 is etched by using the solder plating layer 71, 72 as an etching mask, and thus unnecessary portions of the seed layer 46 are removed. With this, the seed layer 46 is patterned into a plurality of metal films 45, each of which has a shape of hollow hat, as illustrated in FIG. 5B. Such an etching process is preferably performed by using an etching solution. Namely, when the seed layer 46 is wet-etched to form the metal film 45, so-called side-etching and under-etching occur due to a mask effect of the solder plating layer 71. As a result, a peripheral portion of the metal film 45 recede inwardly, and thus a peripheral portion of the solder plating layer 71 protrudes outwardly from the peripheral portion of the metal film 45. Namely, the peripheral portion of the solder plating layer 71 is turned into a protrusion portion 71C. Moreover, because side surfaces of the metal layer 42 and the metal post 43, which are formed of the same material as the seed layer 46 (the metal film 45), are exposed, when the above etching (the wet-etching) process is performed in this process. Therefore, the metal layer 42 and the metal post 43 are partly melted and thus removed, so that peripheral portions of the metal layer 42 and the metal post 43 recede inwardly, due to a mask effect of the solder plating layer 72. With this, a peripheral portion of the solder plating layer 72 is turned into a protrusion portion 72A that protrudes outwardly from the peripheral portions of the metal layer 42 and the metal post 43. In other words, the etching process is performed so that unnecessary seed layer 46 is removed and the peripheral portions of the metal layer 42 and the metal post 43 are partly melted and thus removed.

Figure 5C:
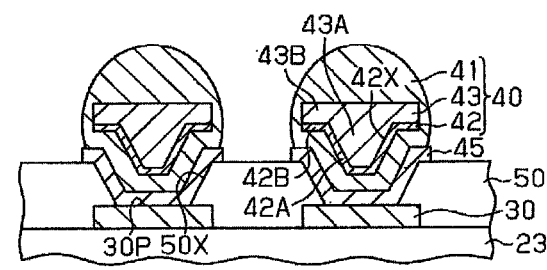
Figure 6A:
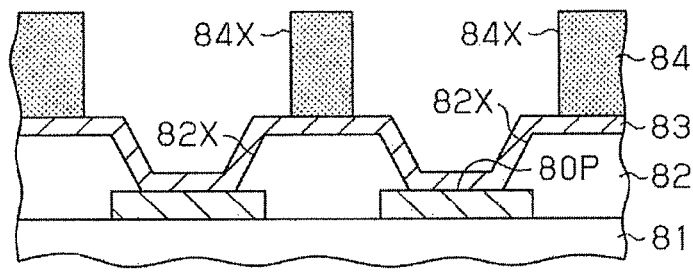
FIGS. 6A through 6D are schematic cross-sectional views illustrating a related-art method of producing a wiring substrate.
Figure 6B:
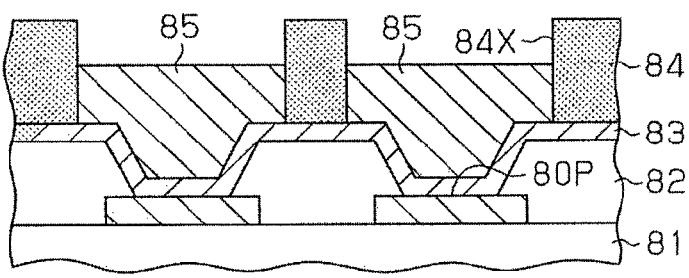
Figure 6C:
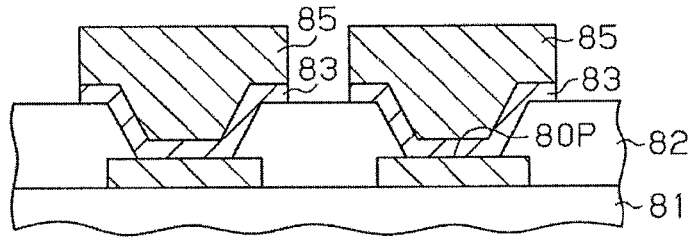
Figure 6D:
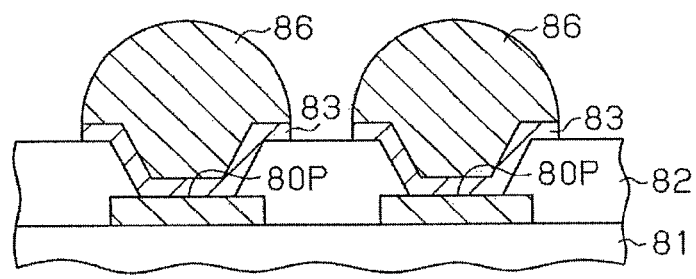
Figure 7:
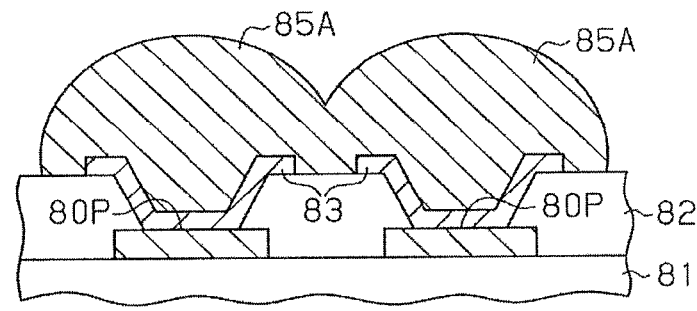
FIG. 7 is an explanatory view illustrating a problem associated with the related-art method of producing the wiring substrate.

A reflow heating process is performed with respect to a structure illustrated in FIG. 5B at a temperature of, for example, about 230 to 260° C. With this, the solder plating layer 71 and the solder plating layer 72, which is positioned above the solder plating 71 with the metal layer 42 and the metal post 43 in-between, are bonded with each other. Specifically, the solder plating layers 71, 72 are melted and merged into one solder layer 41 formed on the metal film 45, as illustrated in FIG. 5C. At the time of the reflow heating process, the solder layer 41 is formed in such a manner that solder is attracted inwardly by the metal layer 42 and the metal post 43 (namely, a Cu layer). Specifically, because the metal post 43 is formed so as to fill in the concave portion 42X of the metal layer 42 and thus to extend in the thickness direction, the solder layer 41 is formed in such a manner that solder is attracted toward the metal post 43 formed to have a relatively larger height. Therefore, the solder is preferably restrained from spreading in a planar direction, and thus the solder layer 41 can be formed to have a relatively grater height. In addition, at the time of the reflow heating process, the peripheral portions of the metal layer 42 and the metal post 43 sandwiched by the two solder plating layers 71, 72 are formed so as to recede inwardly from the peripheral portions of the solder plating layers 71, 72. Therefore, the metal layer 42 and the metal post 43 are easily wrapped by the melted solder plating layers 71, 72. When the metal layer 42 and the metal post 43 are wrapped by the solder plating layers 71, 72 in such a manner, the solder layer 41 is preferably restrained from spreading in the planar direction, and thus extends in the thickness direction. This is because solder is attracted inwardly by the side surfaces of the metal layer 42 and the metal post 43 at the time of the reflow heating process. Therefore, short circuits caused by adjacent two solder layers 41, each of which is formed by re-flowing the solder plating layers 71, 72, are effectively prevented, even when a height of the precipitated solder plating layers 71, 72 is set relatively larger. Moreover, the solder layer 41 is formed so as to extend further in the thickness direction than in the planar direction, which makes it possible to maintain the height of the solder layer 41 as high as possible. In such a manner, the solder bump 40 including the solder layer 41, the metal layer 42, and the metal post 43, the latter two being floated within the solder layer 41, is formed in this process.

Through the above processes, the wiring substrate 10 illustrated in FIG. 1 is produced.

According to this embodiment, the following effects are obtained.

In the solder bump 40, the metal post 43 having a shape of post extending in the thickness direction is held so as to be floated within the solder layer 41. With this, the solder layer 41 is formed so as to be attracted toward the metal post 43 formed within the solder layer 41. Therefore, the solder layer 41 is prevented from spreading in the planar direction, and thus the solder layer 41 can be formed so as to extend further in the thickness direction than in the planar direction, which makes it possible to make the solder layer 41 vertically longer. Thus, adjacent two of the solder layers 41 can be effectively suppressed from causing short circuit. As a result, even when a pitch of the connection pads 30P is made narrower, the solder layer 41 can be formed higher in the thickness direction, thereby obtaining high reliability of electrical connections with the semiconductor chip 60.

As a method of forming higher solder bumps, the following can be considered. Namely, a Cu layer is formed on a seed layer, and a solder plating layer is formed on the Cu layer. Then, reflow-heating is performed, thereby to form a solder layer from the solder plating layer on the Cu layer. According to such a comparative example, the solder bump can be made higher as a whole by the Cu layer formed on the seed layer. However, because the solder plating layer is formed only on the Cu layer in this case, the solder layer spreads in the planar direction, and thus it is difficult to form the solder layer that extends further in the thickness direction. Namely, because only a portion of the Cu layer is covered by the solder layer and thus the solder layer is only attracted by the portion of the Cu layer, it is difficult to maintain the solder layer higher.

On the other hand, the solder bump 40 in this embodiment, because the metal layer 42 and the metal post 43 are entirely covered (or coated) by the solder layer 41, the metal layer 42 and the metal post 43 can entirely serve as a core. With this, the solder layer 41 is formed so as to be attracted inwardly by the metal layer 42 and the metal post 43. In addition, in this case, the solder layer 41 intervenes between the connection pad 30P (the metal film 45) and the metal post 43. Therefore, when the above-mentioned Cu layer is as high as a combination of the metal layer 42 and the metal post 43, the solder bump 40 in this embodiment can be made higher than the solder bump in the comparative example.

Meanwhile, if the metal post 43 is freely rotated within the solder bump 40, an appearance shape of the solder bump 40 may be changed in accordance with the rotation of the metal post 43, which may adversely affect the height of the solder bump 40. In contrast, a portion (a lower end portion of the post portion 43A) of the metal post 43 is arranged within the opening portion 50X in this embodiment. Accordingly, the rotation of the metal post 43 is effectively suppressed at the time of the reflow-heating. In addition, because the portion of the metal post 43 is arranged within the opening portion 50X, even when the metal post 43 is pushed down by the bump 61 of the semiconductor chip 60 at the time of mounting the semiconductor chip 60, the opening portion 50X can function as a guide so that the movement and rotation of the metal post 43 are effectively suppressed.

Because the seed layer 46 (the metal film 45) and the metal post 43 are formed of the same material, the peripheral portion of the metal post 43 is partly melted and removed when the unnecessary portion of the seed layer 46 is removed. Thus, the metal layer 42 and the metal post 43 are easily wrapped by the melted solder plating layers 71, 72 at the time of the reflow-heating. In other words, the solder plating layers 71, 72 are attracted toward the side surfaces to the metal layer 42 and the metal post 43. Therefore, the solder layer 41 can be effectively suppressed from spreading in the planar direction.

Other Embodiments

The above embodiment can be arbitrarily modified without departing from the concept of the present invention, and some of the modifications are described below.

In the above embodiment, the metal layer 42 is formed to have the shape of hollow hat that includes the body portion 42A having the concave portion 42X and the brim portion 42B. However, the shape of the metal layer 42 is not limited to the above. For example, the metal layer 42 may have a T-shape cross section without the concave portion 42X.

In the above embodiment, the solder plating layer 71 is formed to have the shape of hollow hat that includes the body portion 71A having the concave portion 71X, and the brim portion 42B. However, the shape of the solder plating layer 71 is not limited to the above. For example, the solder plating layer 71 may have a T-shape cross section without the concave portion 71X. In this case, the metal layer 42 is formed on the solder plating layer 71, and the metal post 43 having the shape of post (for example, a cylindrical shape) is formed on the metal layer 42.

The metal layer 42 in the above embodiment may be omitted. For example, when the material of the metal post 43 is nickel, the metal layer 42 (the Cu-rich layer) is not necessary. This is because the metal post 43 (the Ni layer) can be favorably formed on the solder plating layer 71 by an electrolytic plating method. In such a case, the metal layer 42 can be omitted.

In the above embodiment, the solder plating layers 71, 72 are formed by the electrolytic plating method. However, without limiting to this, the solder plating layers 71, 72 may be formed by a printing method. Namely, a solder paste is transcribed on the connection pad 30P by the printing method, and thus a first solder layer of a Sn—Cu alloy or the like may be formed. In addition, the metal post 43 may be formed on a first electrically conductive layer by the printing method. Moreover, a solder paste is transcribed on the metal post 43 by the printing method, and thus a second solder layer of a Sn—Cu alloy or the like may be formed. As materials of the first solder layer and the second solder layer, Sn or other materials may be used, instead of the Sn—Cu alloy.

In the wiring substrate 10 according to the above embodiments, an inner structure between the outermost wiring patterns 30, 31 is not particularly limited. In other words, the inner structure may be arbitrarily designed, as long as the outermost wiring patterns 30, 31 are electrically connected with each other through electrically conductive elements that are formed within the wiring substrate 10. In addition, a structure and a material of the core substrate 21 are not particularly limited. Moreover, the number of lower wiring layers (for example, the wirings 25, 26) formed on the core substrate 21 and insulating layers (for example, the insulating layers 23, 24) are not particularly limited. The substrate body 20 may be a coreless substrate, in the place of the build-up substrate with a core having a core substrate 21.

Various aspects of the subject matter described herein are set out non-exhaustively in the following numbered clauses:

1. A method of producing a wiring substrate, comprising:
(a) preparing a structural body comprising a wiring pattern of an outermost layer and a solder resist layer having an opening portion therein, wherein a portion of the wiring pattern is exposed through the opening portion, and the exposed portion of the wiring pattern is defined as a connection pad;
(b) forming a first solder layer on the connection pad;
(c) forming a metal post on the first solder layer;
(d) forming a second solder layer on the metal post; and
(e) unifying the first solder layer and the second solder layer by reflow heating treatment so that the metal post is entirely covered by the unified first and second solder layers.

2. The method according to clause 1, further comprising:
(f) forming a seed layer so as to cover the solder resist layer; and
(g) forming a resist layer having an opening pattern therein on the seed layer, wherein a diameter of the opening pattern is larger than that of the opening portion, and wherein steps (f) and (g) are performed before step (b),
wherein the first solder layer, the metal post, and the second solder layer are formed by an electrolytic plating method using the resist layer as a mask and the seed layer as a power feeding layer.

3. The method according to clause 2, further comprising:
(h) removing the resist layer; and
(i) removing the seed layer by etching using the first solder layer and the second solder layer as a mask while removing a portion of a peripheral portion of the metal post, wherein steps (h) and (i) are performed between step (d) and step (e).

4. The method according to clause 3, further comprising:
(j) forming a metal layer on the first solder layer by an electrolytic plating method whose current density is lower than that of the electrolytic plating method used for forming the first solder resist layer in a state that the structural body is immersed in a plating solution used for forming the first solder resist, wherein the metal layer contains a larger amount of copper than the first solder resist, and wherein step (j) is performed between step (b) and step (c).

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring substrate comprising:
a wiring pattern of an outermost layer;
a solder resist layer having an opening portion therein, wherein a portion of the wiring pattern is exposed through the opening portion, and the exposed portion of the wiring pattern is defined as a connection pad; and
a solder bump on the connection pad and comprising:
a solder layer; and
a metal post that is entirely surrounded by the solder layer, the metal post comprising a post portion and a large diameter portion on the post portion, a diameter of the large diameter portion being larger than that of the post portion in a plane view,
wherein a bottom portion of the solder layer is interposed between the connection pad and the metal post, and
wherein the post portion is extended from the large diameter portion toward the connection pad in a thickness direction of the wiring substrate.

2. The wiring substrate according to claim 1, wherein a portion of the metal post is disposed within the opening portion.

3. A semiconductor device comprising:
the wiring substrate according to claim 1; and
a semiconductor chip mounted on the wiring substrate so as to be electrically connected to the connection pad through the solder bump.

* * * * *